United States Patent
Chen et al.

(10) Patent No.: US 7,992,068 B2
(45) Date of Patent: Aug. 2, 2011

(54) DIGITAL TELEVISION TRANSMISSION WITH ERROR CORRECTION

(75) Inventors: Yingwei Chen, Briarcliff Manor, NY (US); Dagnachew Birru, Yorktown Heights, NY (US); James Wallace Wendorf, Cortlandt Manor, NY (US)

(73) Assignee: IPG Electronics 503 Limited, St. Peter Port (GG)

( * ) Notice: Subject to any disclaimer, the term of this patent is extended or adjusted under 35 U.S.C. 154(b) by 1197 days.

(21) Appl. No.: 10/574,608

(22) PCT Filed: Sep. 30, 2004

(86) PCT No.: PCT/IB2004/051933
§ 371 (c)(1),
(2), (4) Date: Feb. 22, 2007

(87) PCT Pub. No.: WO2005/034521
PCT Pub. Date: Apr. 14, 2005

(65) Prior Publication Data
US 2007/0223888 A1    Sep. 27, 2007

Related U.S. Application Data

(60) Provisional application No. 60/509,019, filed on Oct. 6, 2003, provisional application No. 60/540,138, filed on Jan. 29, 2004.

(51) Int. Cl.
*H03M 13/29* (2006.01)
*H03M 13/35* (2006.01)
*H04N 7/66* (2006.01)

(52) U.S. Cl. ........................ 714/755; 714/774

(58) Field of Classification Search ............... 714/774, 714/755
See application file for complete search history.

(56) References Cited

U.S. PATENT DOCUMENTS

| | | | |
|---|---|---|---|
| 7,010,037 B2 * | 3/2006 | Ye et al. | 375/240.1 |
| 7,082,221 B1 * | 7/2006 | Jiang | 382/239 |
| 7,426,677 B2 * | 9/2008 | Chou et al. | 714/776 |
| 2002/0146074 A1 | 10/2002 | Ariel et al. | |

FOREIGN PATENT DOCUMENTS

DE    19503528 A    8/1996

OTHER PUBLICATIONS

Wayne E. Bretl et al., "PES packets and elementary streams" in "Comprehensive MPEG2 Video Compression Tutorial", Jan. 15, 2000, www.bretl.com.
"ATSC Satandard A/53: Digital Television Standard", Aug. 2001, www.atsc.org.

* cited by examiner

*Primary Examiner* — Stephen M Baker
(74) *Attorney, Agent, or Firm* — Volpe and Koenig, P.C.

(57) ABSTRACT

In a transmitter, a standard stream of encoded multi-media data and uniform error correction data is transmitted through a first channel. The uniform error correction data provides substantially the same error correction for all portions of the encoded multimedia data. Simultaneously, additional unequal error correction data is generated for critical portions of the standard stream and not for other portions of the standard stream, and the additional error correct data is transmitted through a second channel. In a receiver, the additional error correct data is used to error correct just the critical portions of the standard stream, and then the uniform error correction data is used to error correct all the portions of the encoded multimedia data of the standard stream.

27 Claims, 4 Drawing Sheets

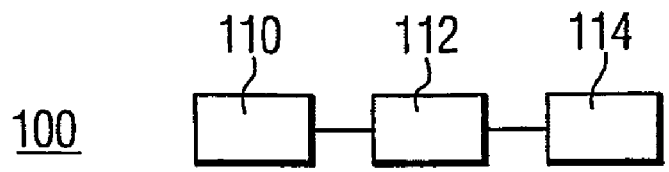
FIG. 1
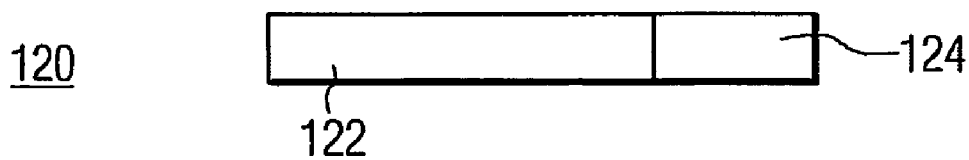
FIG. 2
| A | B | C | D | A' | E' | I' | M' |
| E | F | G | H | B' | F' | J' | N' |
| I | J | K | L | C' | G' | K' | O' |
| M | N | O | P | D' | H' | L' | P' |
140
FIG. 3

| A | B | C |   |   | D |   |   |   | E | F | G |   |   |   |
|---|---|---|---|---|---|---|---|---|---|---|---|---|---|---|
|   |   |   | H |   |   |   |   |   |   |   |   |   |   |   |
|   |   |   | I |   | J | K | L |   |   |   |   |   |   |   |
| M | N | O |   |   |   | P |   |   |   | Q |   |   |   |   |

| l | l | l |   |   | l |   |   |   | l | l | l |   |   |   |
|---|---|---|---|---|---|---|---|---|---|---|---|---|---|---|
|   |   |   |   |   | l |   |   |   |   |   |   |   |   |   |
|   |   |   | l |   |   | l | l |   |   |   |   |   |   |   |
| l | l | l |   |   |   | l |   |   |   | l |   |   |   |   |

| A' | B' | C' | D' | E' | F' | G' | H' |
|----|----|----|----|----|----|----|----|
| I' | J' | K' | L' | M' | N' | O' | P' |
| Q' |    |    |    |    |    |    |    |

| l |   |   | l | l |   | l | l |   | l |   |   |   |   |   |
|---|---|---|---|---|---|---|---|---|---|---|---|---|---|---|
|   | l | l |   |   |   |   | l |   |   | l |   |   | l | l |
|   |   |   | l |   |   |   |   |   |   |   |   | l |   | l |
| l |   |   |   | l |   |   |   |   |   |   |   |   |   |   |

| A' | M' | B' | N' | C' | O' | H' | I' |
|----|----|----|----|----|----|----|----|
| D' | J' | K' | P' | L' | E' | Q' | F' |
| G' |    |    |    |    |    |    |    |

DIGITAL TELEVISION TRANSMISSION WITH ERROR CORRECTION

CROSS REFERENCE TO RELATED APPLICATION

This application claims the benefit of U.S. provisional application Ser. No. 60/509,019 filed Oct. 6, 2003 and application Ser. No. 60/540,138 filed Jan. 29, 2004, which are incorporated herein by reference.

The invention is related to the field of digital television transmission through a noisy medium with error correction. The noise in the medium results in errors in the received data which require error correction for reasonable display quality.

The invention is related to the field of digital television transmission through a noisy medium with error correction. The noise in the medium results in errors in the received data which require error correction for reasonable display quality.

Digital multimedia data streams such as MPEG streams are extremely vulnerable to transmission errors. If error correction is not provided, then even a one bit error could prevent the decoding of significant portions of the MPEG stream. Proposed digital television standards such as the proposed ATSC standard for DTV and the proposed DVB standard, provide forward error correction data that can correct some of the errors that occur during transmission. The error correction data is typically redundant data in the form of parity bits. The amount of errors that can be corrected by an error correction scheme, depends on the amount of error correction data that is provided in the scheme. Small errors such as random single bit errors are more common than large burst errors so that a small amount of error correction data is sufficient to correct most errors. Also, no practical amount of error correction data can eliminate all possible transmission errors. Thus, these proposed standards are based on a trade off between the robustness of the error correction and the amount of error correction data that has to be transmitted.

The proposed digital television technologies provide acceptable reception for low noise transmission channels such as those provided by current cable and satellite television transmission schemes. However, there is a need to provide more robust error correction for television transmission through noisier channels such as extended cable systems, terrestrial broadcast, internet transmission, cell phone transmission, and wireless network transmission channels.

Recently, schemes for unequal protection or prioritized protection of video data has been widely proposed in the literature. These schemes take advantage of the fact that errors in some portions of digital multimedia stream are more critical than errors in other portions of the stream. An error in an important portion of the digital multimedia stream can cause loss of significant data, for example, an error in the header of an MPEG video I-frame can prevent decoding of an entire group of video frames, an error in an audio frame can result in an unintelligible word. However, an error in a less important portion of the digital multimedia stream might not even be perceivable.

In proposed unequal protection schemes, the digital multimedia stream is divided up into different portions of different types of data that contribute different amounts to the quality of the presentation. Then the portions of the type of data that contributes more to the presentation quality are made more robust than portions of other types of data by, for example, providing more data redundancy or by providing for more retries to correctly transmit the more important types of data. Commonly in these schemes, the transmission channel that is used to transmit the multimedia stream is divided time-wise for the different portions of the video signal.

A channel is a portion of a communication resource through which communication signals can be transmitted, the transmission of signals through one channel being substantially independent of any transmission of other signals through other channels of the communication resource. A channel communication is a signal transmission through a channel. A channel has predetermined properties such as a predetermined transmission rate or bandwidth that is substantially independent of communications through other channels. For example, a channel may be a conductive path through which electrical signals are transmitted or a frequency band over which electromagnetic signals are transmitted. Only one transmitter at a time can transmit information through the same channel. The resource may be a medium or a series of different mediums. A Channel may be divided or sliced into multiple channels, for example, by time slicing and/or frequency slicing a channel, so that different transmitters can independently transmit different signals through different slices of the same channel. Each slice of a channel that provides substantially independent transmission is also referred to as a channel. Herein, channels are defined from the viewpoint of the transmitter and receiver. That is, a communication resource through which a signal is transmitted is considered a channel as long as the transmission and reception of the signal is substantially independent of the communication through other channels.

Communications through switched packet networks, like the internet, are not restricted to channels within the switched packet network, but typically such communications are restricted to channels into and out of the internet so that they meet the above definition for channel communication.

Those skilled in the art are directed to the following citations which are hereby incorporated in whole by reference.
"PES packets and elementary streams" in "Comprehensive MPEG2 Video Compression Tutorial" by Wayne E. Bretl and Mark Fimoff, Jan. 15, 2000, at www.bretl.com
"ATSC Standard A/53: Digital Television Standard", August 2001, at http://www.atsc.org In the multimedia stream transmitter of the invention, the stream transmitter receives a standard multimedia data stream. The stream contains encoded multimedia data and uniform error correction data that is useful for error correcting the encoded multimedia data. The uniform error correction data provides substantially the same robustness of error correction for each portion of the encoded multimedia data of the standard multimedia data stream. The transmitter selects some stream portions of the encoded multimedia data stream but not other stream portions of the encoded multimedia data stream. The selection depends on the importance of the selected stream portions to the correct decoding of the encoded multimedia data. The transmitter generates selection map data indicating which of the stream portions were selected. The transmitter also generates additional unequal error correction data for error correcting the selected stream portions and does not generate such additional unequal error correction data for the other stream portions that were not selected. The transmitter transmits the standard multimedia stream through a first channel and transmits enhancement data including the selection map data and the additional unequal error correction data through a second channel. The second channel is a different channel than the first channel, that is, the transmission of information signals through the first channel is independent of the transmission of information signals through the second channel.

In the multimedia data stream receiver of the invention, the receiver receives the standard multimedia data stream from the first channel, and the enhancement data from the second channel. The receiver selectively error corrects the selected portions of the standard multimedia data stream according to the selection map data using the additional unequal error correction data. The receiver also uniformly error corrects all the encoded multimedia data using the uniform error correction data.

The advantages of the combination of uniform error correction in combination with additional unequal error protection for critical portions of the multimedia data include that most errors in the less critical portions of the multimedia data are corrected while even more extensive errors are corrected in more critical portions of the encoded multimedia data. The advantages of transmitting the standard multimedia data stream with uniform error correction through a first channel and the unequal error correction through the second channel include that the standard multimedia data stream with uniform error correction is compatible with a receiver that only receives the standard stream from the first channel and does not receive the enhancement data from the second channel. Thus the transmitter of the invention can be used for a standard receiver that does not utilize the invention. In a broadcast embodiment where multiple receivers at different locations receive signals from the same transmitter of the invention, and some receivers receive a noisier signal than other receivers, the receivers that receive the noisier signal can utilize the invention to obtain improved quality of reception, while less complex receivers that do not utilize the invention, can be used to receive a less noisy signal.

The transmitter may generate third error correction data portions useful for error correcting the enhancement data. The third error correction data can provided substantially the same uniform robustness of error correction for each portion of the enhancement data. The receiver may error correct the enhancement data before error correcting the selected portions of the standard stream. The transmitter may generate an enhancement stream of enhancement transmission frames. Each enhancement transmission frame may include a fixed-size portion of the enhancement data and a fixed-size portion of the third error correction data.

The standard stream may contain fixed-size elementary stream packets, the packets each containing a packet header and a packet data portion. The packets may include video packets which contain video data in their packet data portion and audio packets which contain audio data in their packet data portion.

The standard stream may be organized into fixed-size standard transmission frames, each standard transmission frame containing a fixed-size portion of the encoded multimedia data and a fixed-size portion of the uniform error correction data. The uniform error correction data contained in each frame may be for error correcting the encoded multimedia data contained in the same frame.

The standard transmission frames may be logically organized into groups of multiple standard transmission frames for efficiently generating and organizing selection map data and unequal error correction data for the selected portions of encoded multimedia data. The selecting of portions of encoded multimedia data may include: selecting substantially all the audio portions; selecting substantially all the video portions that contain video header information; and selecting sequences of video portions immediately following each video portion containing the video header data, the number of portions in the sequence depending on a predetermined bit rate for the second transmitting. The selection map data and/or unequal error correction data may each be transmitted in the same order as the encoded multimedia data portions for which they are generated are transmitted. Alternatively, the selection map data and/or unequal error correction data may be transmitted in an interleaved order with respect to the order that the encoded multimedia data portions for which they are generated are transmitted.

The enhancement data for each group of standard transmission frames may be organized into multiple fixed-size enhancement data transmission portions. A corresponding fixed-size third error correction portion may be generated for each enhancement data transmission portion. An enhancement data stream of fixed-size enhancement transmission frames may be generated by the transmitter, with each of multiple enhancement transmission frames containing one of the enhancement data transmission portions and one of the third error correction portions for the group of standard frames. The third error correction portion in each enhancement transmission frame may be for error correcting the enhancement data contained in the same enhancement transmission frame.

Each enhancement data transmission portion may contain a fixed-size portion of the selection map data and a fixed-size portion of the additional unequal error correction data. Alternatively, all the selection map data may be sent together in subsequent sections of the enhancement data transmission portions and also all the additional unequal error correction data may be sent together in other subsequent sections of the enhancement data transmission portions.

The selected stream portions may include audio portions and video portions and the selection may include selecting substantially all of the audio portions and selecting all the video portions that contain video header information and selecting sequences of video portions that immediately follow the video portions that contain header information, the size of the sequences depending on a predetermined bit rate for the transmission of the enhancement data stream.

In the case where the packets are organized into multiple segments and the selected stream portions are packet segments, then the selected stream portions should also include the packet header of any packet containing a selected packet segment.

The standard multimedia data stream may be transmitted through the first channel by using the standard multimedia data stream to modulate a first analog carrier wave at a first carrier frequency and transmitting the first modulated carrier wave through a physical media. The enhancement data stream may be transmitted through a second channel by using the enhancement data stream to modulate a second analog carrier wave at a second carrier frequency that is different than the first carrier frequency and transmitting the second modulated carrier wave through the physical media.

Additional aspects and advantages of the invention will become readily apparent to those skilled in the art from the detailed description below with reference to the following drawings.

FIG. 1 shows an example embodiment of the multimedia transmitter of the invention.

FIG. 2 illustrates a portion 120 of an example standard multimedia data stream.

FIG. 3 illustrates an example group of 4 standard frames in which the uniform error correction data for error correcting packets is interleaved.

FIG. 4a illustrates an example of the selection of portions in a group of 4 standard transmission frames of the standard multimedia data stream in the invention.

FIG. 4b illustrate a first example embodiment of the selection map data for the selected portions of FIG. 4a.

FIG. 4c illustrates a first example embodiment of the unequal error correction data of the invention.

FIG. 4d illustrates another example embodiment of the selection map data of the invention in which the selection map data is interleaved with respect to the order of the portions of the standard stream for which the selection map data was generated.

FIG. 4e illustrates another example embodiment of the unequal error correction data of the invention in which the unequal error correction data is interleaved with respect to the order of portions of the standard stream for which the unequal error correction data was generated.

FIG. 6a illustrates a first example embodiment of the organization of the selection map data and unequal error correction map data into the enhancement data transmission portions of a group of enhancement transmission frames for the group of standard transmission frames shown in FIG. 4a.

FIG. 6b illustrates a second example embodiment of the organization of the selection map data and additional unequal error correction data into the enhancement data transmission portions of a group of enhancement transmission frames for the group of standard transmission frames shown in FIG. 4a.

Figure 5:
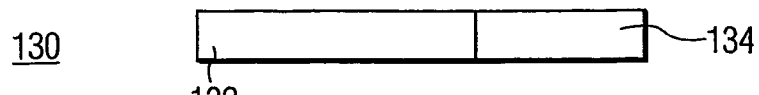
FIG. 5 illustrates an example embodiment of an enhancement transmission frame of the invention.

In the following descriptions of the drawings, the use of the same labels in different figures indicate similar apparatus.

FIG. 1 shows an example embodiment of the multimedia transmitter 100 of the invention. Receiver 110 provides multimedia data to signal processor 112. A standard multimedia data stream is provided by receiver 110 alone or in combination with signal processor 112. The standard stream includes encoded multimedia data and uniform error correction data. The uniform error correction data provides substantially the same robustness of error correction for each portion of the encoded multimedia data.

Receiver 110 may include for example, an input for receiving multimedia data, a media drive to read multimedia data from a record carrier, and a camera and microphone for receiving the multimedia data from the environment. The receiver may receive the standard multimedia data stream; or the receiver may receive encoded multimedia data in which case, the signal processor generates the error correcting data and formats the encoded multimedia data and error correction data into the standard multimedia steam; or the receiver may only provide raw multimedia data in which case, the signal processor also encodes the raw data into encoded multimedia data.

Signal processor 112 selects some stream portions of the standard multimedia data stream but not other stream portions of the standard multimedia data stream. The selection depends on the importance of the type of data contained in the stream portions to the quality of the presentation of the multimedia data. The signal processor also generates selection map data indicating which of the stream portions were selected. The signal processor also generates additional unequal error correction data for the selected stream portions and not for other stream portions that were not selected.

Transmitter 114 transmits the standard multimedia data stream into a first channel, and transmits enhancement data including the selection map data and the additional unequal error correction data into a second channel. The second channel is a different channel than the first channel. Thus, both uniform error correction data and unequal error correction data are provided for the selected portions of the standard stream, and at least uniform error correction data is provided for the portions of the standard stream that are not selected.

FIG. 2 illustrates a portion 120 of an example standard multimedia data stream. The standard stream may for example, conform to a proposed ATSC DTV standard or a proposed DVB standard. The stream may consist of sequentially fixed-size standard transmission frames. Each standard frame may contain a fixed-size multimedia data portion 122 of encoded multimedia data followed by a fixed-size uniform error correction portion 124 of uniform error correction data that can be used for error correcting the encoded multimedia data. The error correction data in the standard frame may be for example, forward error correction (FEC) data. The encoding may be for example, MPEG type encoding (e.g. MPEG-2 encoding) in which case, the encoded multimedia data consists of fixed-size 188 byte elementary stream packets, each packet having a packet header and a packet data portion, the packet heading including an ID, the packet data portions containing the encoded multimedia data. For an MPEG encoded standard stream, each multimedia data portion may contain a fixed integral number of MPEG packets. For television, the packets of an MPEG stream typically include video packets with packet data portions containing only video data and audio packets with packet data portions containing only audio data.

The error correction data in each standard frame may be for error correcting the encoded multimedia data only in that same standard frame, or it may also be for error correcting the encoded multimedia data in other standard frames. FIG. 3 illustrates a group of 4 standard frames in which the uniform error correction data for error correcting packets is interleaved in different order than the order of the packets in the standard frames. For example in FIG. 3, uniform error correction data B', C' and D' for error correcting respective packets B, C and D are contained in different standard frames of the group of frames than packets B, C, and D.

Channels are considered to be different when the transmission of a data signal in one channel is substantially independent of the transmission of a data signal in another channel. For example, in broadcasting, channels are typically different frequency bands of the electromagnetic spectra, while in TDMA cellular systems different channels are often different predetermined time slices of the same frequency band. In spread spectrum communications (such as CDMA cellular systems), a channel includes time slices of multiple frequency bands. However, a scheme for dynamic allocation of the same channel to multiple transmitters depending on varying data rates would not be considered substantially independent transmission.

For example, transmitter 114 can use the standard multimedia stream to modulate a first analog carrier wave at a first frequency and transmit the modulated carrier wave into a medium and then use the enhancement data stream to modulate a second analog carrier wave at a second frequency that is different than the first frequency and transmit the second modulated carrier wave into the medium. In this case the medium could be any substance that can transmit waves such as sound or electromagnetic waves. The transmitter may, for example, include a laser for transmitting light waves through an optical fiber, or an antenna for transmitting radio waves or micro waves through space.

FIG. 4a shows an embodiment of a group of 4 standard transmission frames of the standard multimedia data stream with selected portions of the standard stream indicated by letters. Portions of the standard stream that were not selected are blank. The selected portions may include portions of the uniform error correction data or selection may be restricted to include only the encoded multimedia data as shown in FIG. 4a. The selected portions may be MPEG packets or they may be packet segments which are subdivisions of the MPEG packets. For example, if the packets each contains 188 bytes, then each packet can be logically subdivided into 6 packet segments wherein the first 5 packet segments each contain 32 bytes and the 6th packet segment contains 28 bytes.

The number of standard frames in a group (i.e. group size) depends on tradeoffs among delay, buffering requirements, and bandwidth efficiency. For example, a larger group of standard frames, introduces more delay in processing the standard frames (and delay in processing the enhancement data), and requires larger buffers to hold the data, but results in more efficient packaging of the enhancement data resulting in higher bandwidth efficiency.

FIG. 4b illustrates a first example embodiment of the selection map data of the invention, the selection map data being for the selected portions shown of FIG. 4a. In this embodiment, the selection map is a bit map in which a 1 indicates that a corresponding portion of the standard frame was selected and a 0 indicates that the corresponding portion of the standard frame was not selected. The 0's are not shown in FIG. 4b in order to simplify the illustration.

FIG. 4c illustrates a first example embodiment of the unequal error correction data of the invention. FIG. 4c shows the error correction data for error correcting the selected portions of FIG. 4a. For example, error correction data A', B', C' are for error correcting selected packets A, B, C respectively in the standard frames of FIG. 4a.

FIG. 4d illustrates another example embodiment of the selection map data of the invention in which, the selection map data is interleaved with respect to the order of the portions of the standard stream for which the selection map data was generated. For example, the first four bits in the first row of the selection bit map of FIG. 4d indicates whether the first packet of each of the 4 standard frames were selected.

FIG. 4e illustrates another example embodiment of the unequal error correction data of the invention in which the unequal error correction data is interleaved with respect to the order of portions of the standard stream for which the unequal error correction data was generated. In FIG. 4e, the first two portions of unequal error correction data A' and M' are for error correcting packets A and M respectively. Alternatively, the selection map data may be in the form shown in FIG. 4b while the unequal error correction data may be in the form shown in FIG. 4e so that the unequal error correction data in interleaved with respect to the selection map data.

In FIG. 1, signal processor 112 may also generate third error correction data for error correcting the enhancement data. The third error correction data provide substantially the same uniform error correction for all of the enhancement data. In this case, transmitter 114 would also transmit the third error correction data with the enhancement data through the second channel.

Signal processor 112 may organize the enhancement data into an enhancement data stream of fixed-size enhancement transmission frames. FIG. 5 illustrates a portion of an example embodiment of an enhancement data stream. Each enhancement transmission frame consisting of a fixed-size enhancement data transmission portion 132 containing enhancement data and a fixed-size third error correction transmission portion 134 containing third error correction data for error correcting the enhancement data. In this case, transmitter 114 would transmit the enhancement stream into the second channel.

The third error correction data in each enhancement transmission frame may be forward error correction data. The error correction data in each enhancement transmission frame may be for error correcting the enhancement data in that same enhancement transmission frame, or it may also be for error correcting enhancement data in other enhancement transmission frames in a manor similar to the interleaving of error correction data in the standard frames in FIG. 3.

Figure 6A:
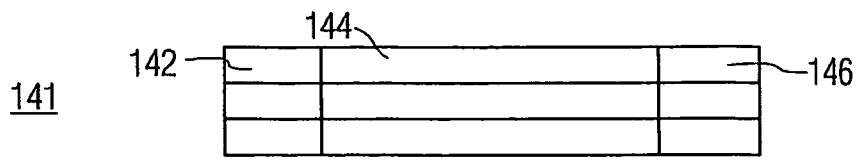
Figure 6B:
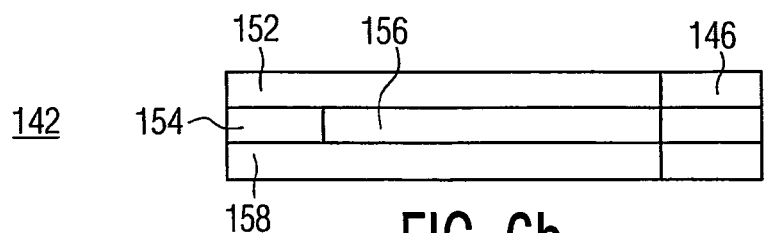

FIGS. 6a and 6b illustrate different example embodiments for organizing the selection map data and unequal enhancement map data into the enhancement data transmission portions of a group of enhancement transmission frames for the group of standard transmission frames shown in FIG. 4a. The number of frames in a group of enhancement transmission frames will depend on the number of frames in the corresponding group of standard frames and on the proportion of the portions of the standard frames that are selected for providing the additional unequal error correction. In FIG. 6a, each of the 3 enhancement transmission frames includes a fixed-size portion 142 of the selection map data of FIG. 4b followed by a fixed-size portion 144 of the unequal error correction data of FIG. 4c followed by a portion 146 of the third error correction data. In FIG. 6b subsequent portions 150 and 152 of selection map data are contained in the first two enhancement transmission frames. The selection map data is followed by subsequent portions 154 and 156 of unequal error correction data. Typically, the selection map data will be much smaller than unequal error correction data.

The signal processor 112 selects the portions of the standard multimedia data stream that contain the most important types of data for maintaining the quality of the multimedia presentation. The most important portions of the data depends on the type of multimedia data contained in the standard data stream. Audio portions should be selected because the audio data is typically only a small proportion of the multimedia data and audio is generally more important to the understanding of multimedia presentation than other portions. Even relatively small losses of audio data can render an presentation unintelligible. For an MPEG based standard stream of packets, the audio packets can be identified by the packet ID. Also, video portions containing header information should be selected because header information is critical for decoding other video data. The video header information in a typical MPEG video stream includes frame headers, slice headers, macroblock headers, and block headers. For an MPEG based standard stream, the packets have to be parsed to identify portions containing video headers. Finally, sequences of subsequent video portions (that immediately follow any video portion that contains header information) should also be selected, the number of video portions in the sequences of video portions may depend on a predetermined criteria. The predetermined criteria may include a proportion of the packets that are to receive enhanced protection, the proportion of packets being dynamically adjusted to at least approximately provide a predetermined bit rate for the second transmitting.

When the standard multimedia signal consists of packets and the packets are logically subdivided into segments which are the portions that are selected, then when any segment of a packet is selected, then the packet headers for the selected segments should also be selected, because the packet header is critical for decoding the packet.

Figure 7:
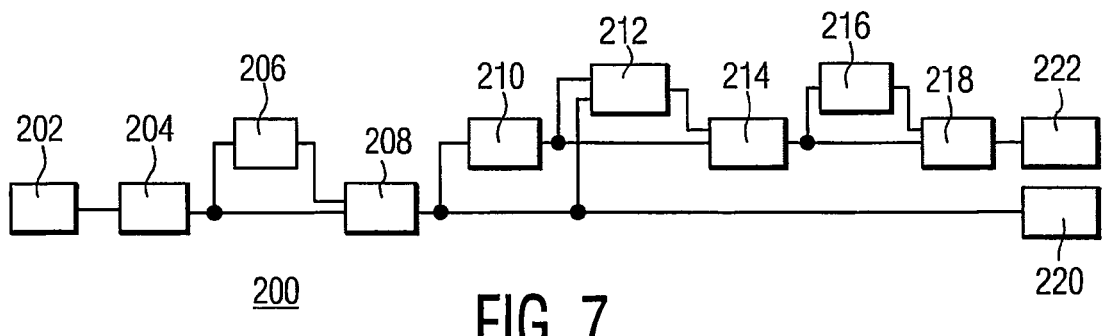
FIG. 7 illustrates a more detailed example embodiment of the multimedia transmitter of the invention.

FIG. 7 illustrates a more detailed example embodiment of the multimedia transmitter 200 of the invention. Receiver 202 provides raw multimedia data. Encoder 204 converts the raw multimedia data into encoded multimedia data. Error correction coder 206 generates uniform error correction data for the encoded multimedia data, the uniform error correction data providing substantially the same robustness of error correction for each portion of the encoded multimedia data. Multiplexer 208 formats the encoded multimedia data and the uniform error correction data to provide a standard multimedia data stream. Selector 210 selects some stream portions of the standard multimedia data stream but not other stream portions of the standard multimedia data stream for additional unequal error correction, and generates selection map data indicating which of the stream portions were selected for the additional unequal error correction. The selection depends on the importance of the type of data contained in the stream portions to the quality of the presentation of the multimedia data. Error correction coder 212 generates additional unequal error correction data for the selected stream portions indicated by the selection map data and not for other stream portions that were not selected. Multiplexer 214 formats the unequal error correction data and the selection map data together to provide enhancement data transmission portions. Error correction coder 216 generates third error correction data for error correcting the enhancement data transmission portions. Multiplexer 218 formats the enhancement data transmission portions and enhancement error correction data together to provide an enhancement data stream. The data stream may consist of enhancement transmission frames as described above in relation to FIG. 5.

Transmitter 220 transmits the standard multimedia data stream into a first channel, and transmitter 222 transmits the enhancement data stream into a second channel, the second channel being different than the first channel.

The elements of the embodiment of FIG. 7 are described as separate components but in an efficient design, portions of the components may be shared, and it is expected that in a commercial embodiment, some portions of the multimedia transmitter will be implemented in software and other portions will be implemented in hardware.

Figure 8:
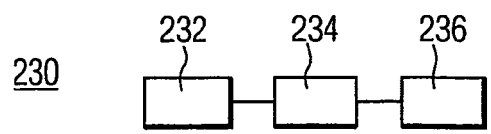
FIG. 8 shows an example embodiment of the multimedia receiver of the invention.

FIG. 8 shows an example embodiment 230 of the multimedia receiver of the invention that uses both the uniform error correction data and the unequal error correction data for error correcting a standard multimedia data stream. Receiver 232 receives a standard multimedia data stream from a first channel, the standard stream containing encoded multimedia data and uniform error correction data. Receiver 232 also receives enhancement data including selection map data and unequal error correction data from a second channel, the second channel being different than the first channel.

Processor 234 first error corrects portions of the standard stream according to the selection map data using the additional unequal error correction data. The selection map data indicates which portions of the standard stream are to be corrected in the first correcting and which other portions of the standard stream are not be corrected in the first correcting. Processor 234 also second error corrects all the encoded multimedia data using the uniform error correction data, the uniform error correcting providing substantially the same robustness of error correction for each portion of the multimedia data of the standard stream. Any portion of the multimedia data that can not be error corrected may be discarded. Transmitter 236 outputs the error corrected encoded multimedia data to a medium after the first and second error correcting of the data. Transmitter 236 may include: a display for presenting the multimedia data to an audience, a recorder for recording the multimedia data on a record carrier, an optical laser transmitter for transmitting the multimedia data through an optical cable, an antenna for transmitting the multimedia data through space, and/or any other type of media into which signals can be transmitted.

Either the uniform error correction or the unequal error correction may preformed first on each portion of the multimedia data. However, if portions of the uniform error correction data were selected for additional unequal error correction, then they should be error corrected before they are used for the uniform error correction.

The enhancement data received by receiver 232 from the second channel may be in any of the forms of the enhancement data described as being transmitted by transmitter 114 of FIG. 1 or transmitter 222 of FIG. 7. For example, it may accompany third error correction data or it may be formatted into enhancement transmission frames as described above.

The output of transmitter 236 may be the error corrected standard multimedia data stream or just the error corrected multimedia data without the uniform error correction data.

Signal processor 234 may also decode the encoded multimedia data to provide raw multimedia data. In that case transmitter 236 may include a simple presentation device (e.g. a television without an MPEG decoder) for presenting the decoded multimedia data to an audience.

Figure 9:
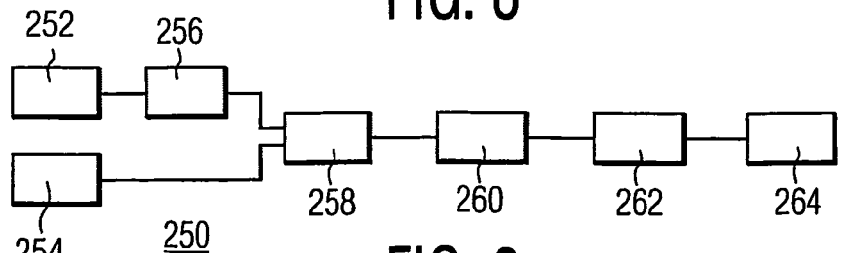
FIG. 9 illustrates a more detailed embodiment of the multimedia receiver of the invention.

FIG. 9 illustrates a more detailed embodiment of the multimedia receiver of the invention. A first receiver 252 receives a standard multimedia data stream from a first channel. The standard stream contains encoded multimedia data and uniform error correction data for error correction of the multimedia data. The uniform error correction data provides substantially the same robustness of error correction for each portion of the encoded multimedia data.

Second receiver 254 receives enhancement data including selection map data and additional unequal error correction data from a second channel. The second receiver also receives third error correction data from the second channel. The second channel is a different channel than the first channel.

First error correction unit 256 error corrects the enhancement data using the third error correction data. Second error correction unit 258 provides a first error correcting of portions of the standard data stream according to the selection map data using the additional unequal error correction data. Third error correction unit 260 provides a second error correcting of the encoded multimedia data using the uniform error correction data. Decoder 262 converts the encoded multimedia data (after the first and second error correcting) into decoded (raw) multimedia data. Transmitter 264 outputs the decoded multimedia data after the first and second error correcting of the data.

Figure 10:
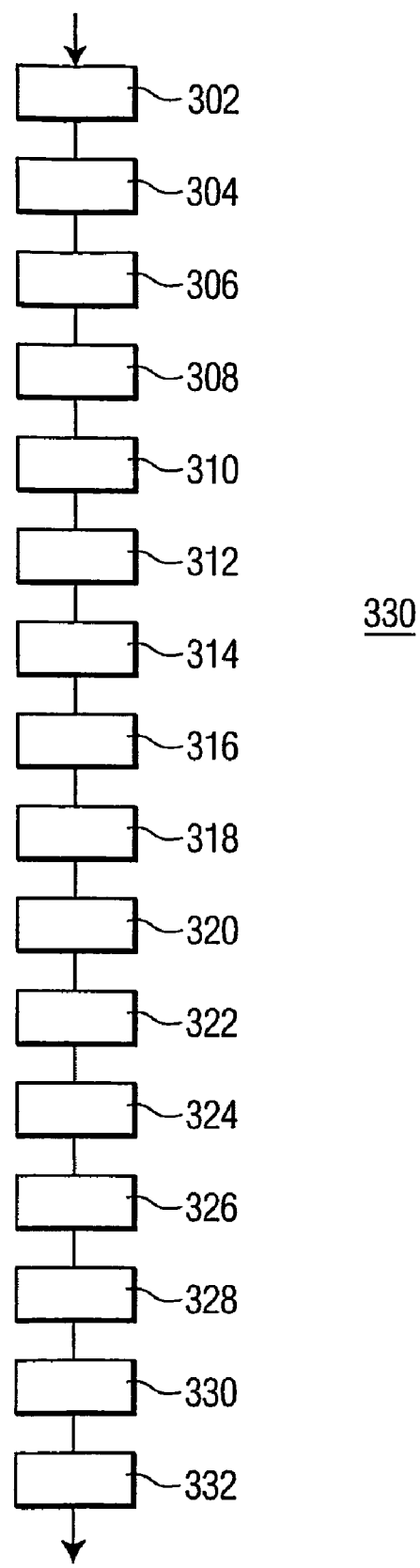
FIG. 10 is a flow diagram illustrating an example embodiment of the method of the invention.

FIG. 10 is a flow diagram illustrating a specific example embodiment of the method of the invention. In step 302 raw multimedia data is provided. Raw means that the data is not yet encoded. The raw data may be provided from a data capture devices such as a cameras and microphones or other well known methods may be used for providing multimedia data. The raw data may be analog or digital data. In step 304 the multimedia data is encoded to provide encoded multimedia data. MPEG encoding may be used for compressing video. There are a large number of currently used and proposed method for encoding multimedia data that could be used in the invention. The encoding may include digitalizing analog multimedia data. In step 306, uniform error correction data is generated. The uniform error correction data is useful for error correcting the encoded multimedia data. The uniform error correction data provides substantially the same robustness of error correction for all portions of the encoded multimedia data. In step 308, a standard multimedia data stream of sequential standard transmission frames is generated. Each standard frame contains a fixed-size portion of the encoded multimedia data followed by a fixed-size portion of the uniform error correction data.

In step 310, some stream portions of the standard multimedia data stream are selected but other stream portions of the multimedia data stream are not selected. The selection depends on the importance of the type of data contained in the stream portions to the quality of the presentation of the multimedia data. In step 312, selection map data indicating which stream portions were selected is generated. In step 314, additional unequal error correction data is generated for each selected stream portion and not for the other stream portions that were not selected. Thus, additional unequal error correction data is provided for the more important portions of the standard stream.

In step 316, third error correction data is generated for error correcting the enhancement data. The enhancement data includes the selection map data and the additional unequal error correction data. The third error correction data provides substantially the same uniform error correction for all portions of the enhancement data. In step 318, an enhancement data stream of fixed-size enhancement transmission frames is generated, each enhancement transmission frame contains a fixed-size portion of enhancement data and a fixed-size portion of the uniform error correction data.

In step 320, the standard multimedia data stream is transmitted into a first channel of a medium. In step 322 the enhancement data stream is transmitted into a second channel of the same or a different medium. The second channel is a different channel than the first channel.

In step 324, the standard multimedia data stream is received from the first channel. In step 326, the enhancement data stream is received from the second channel. In step 328, the enhancement data is error corrected using the third error correction data of the enhancement data stream. In step 330, the selected stream portions are error corrected according to the selection map data using the additional unequal error correcting data. In step 332, all of the encoded multimedia data portions are error corrected using the uniform error correction data.

The invention has been described above in relation to specific example embodiments. Those skilled in the art will know how to modify these example embodiments within the scope of the invention herein. The invention is only limited by the following claim.

The invention claimed is:

1. A method comprising:
    providing a standard multimedia data stream, the stream containing encoded multimedia data and standard uniform error correction data for error correcting the encoded multimedia data, the uniform error correction data providing substantially the same uniform error correction for each portion of the encoded multimedia data;
    selecting some stream portions of the standard multimedia data stream but not other stream portions of the multimedia data stream for additional unequal error correction, the selection depending on the importance of the type of data contained in the stream portions to the quality of the presentation of the multimedia data;
    generating additional unequal error correction data for corresponding selected stream portions and not for the other stream portions that were not selected;
    first transmitting the standard multimedia data stream with the uniform error correction data;
    second transmitting enhancement data including the additional unequal error correction data;
    whereby for the selected stream portions, both uniform error correction data and additional unequal error correction data are transmitted, and for the other stream portions, only uniform error correction data are transmitted.

2. The method of claim 1 wherein:
    the first transmitting includes using the standard multimedia data stream to modulate a first analog carrier wave at a first frequency and transmitting the modulated carrier wave through a medium; and
    the second transmitting includes:
    generating an enhancement data stream containing the selection map data and the unequal error correction data; and
    using the enhancement data stream to modulate a second analog carrier wave at a second frequency that is different than the first frequency and transmitting the second modulated carrier wave through the medium.

3. The method of claim 1, further comprising:
    receiving the standard multimedia data stream from a first channel;
    receiving selection map data and the unequal error correction data from a second channel;
    first error correcting the selected stream portions according to the selection map data using the additional unequal error correcting data;
    second error correcting the encoded multimedia data portions using the uniform error correction data.

4. The method of claim 1 wherein the first transmitting the standard multimedia data stream with the uniform error correction data is transmitted into a first channel; and
    the second transmitting enhancement data including the additional unequal error correction data is transmitted into a second channel, the second channel being a different channel than the first channel.

5. The method of claim 1 wherein providing a standard stream includes:
    providing raw multimedia data;
    encoding the raw multimedia data to provide encoded multimedia data;
    generating uniform error correction data for the encoded multimedia data, the uniform error correction data providing substantially the same robustness of error correction for all portions of the encoded multimedia data; and
    generating the standard multimedia data stream of sequential standard transmission frames, each standard frame containing a fixed-size portion of the encoded multimedia data followed by a fixed-size portion of the uniform error correction data.

6. The method of claim 5 wherein:
    the encoded multimedia data includes elementary stream packets;
    the packets each contain a packet header and a packet data portion;
    the packets include video packets and audio packets, the packet data portions of the video packets containing video data and the packet data portions of audio packets containing audio data;
    each standard transmission frame contains the uniform error correction data generated for error correcting the encoded multimedia data contained in the same standard frame;

the uniform error correction data includes forward error correction data; and the standard multimedia data stream conforms with a ATSC DTV standard or a DVB standard.

7. The method of claim 1 wherein:

the method further comprises generating third error correction data for error correcting the enhancement data, the third error correction data providing substantially the same uniform error correction for all of the enhancement data; and the second transmitting includes transmitting the third error correction data with the enhancement data.

8. The method of claim 7 wherein:

the method further comprises generating an enhancement data stream of fixed-size enhancement transmission frames, each enhancement transmission frame containing a fixed-size portion of enhancement data and a fixed-size portion of the uniform error correction data, the enhancement data including the selection map data and the additional unequal error correction data; and the second transmitting includes transmitting the enhancement data stream.

9. The method of claim 8 wherein:

the multimedia stream includes audio portions containing audio data and the more important stream portions that are selected include substantially all the audio portions;

the third error correction data contained in each of multiple enhancement transmission frames is for error correcting the enhancement transmission data of the same enhancement transmission frame;

the additional unequal error correction data is transmitted in the same order as the portions of the standard data stream for which it was generated; and the uniform error correction data and the additional unequal error correction data and the third error correction data each include forward error correction data.

10. The method of claim 1 wherein:

the selected stream portions include video portions containing video data and audio portions containing audio data; and selecting the stream portions includes:

selecting substantially all of the audio portions;

selecting substantially all of the video portions that contain video header information; and selecting sequences of video portions immediately following the video portions containing header information, the number of video portions in the sequences of video portions depending on a predetermined criteria related to a predefined bit rate for the second transmitting.

11. The method of claim 10 wherein:

the stream portions being fixed-size packets, each packet containing a packet header and a packet data portion, the audio data being packed into the packet data portions of audio packets and the video data being packed into the packet data portions of video packets;

the video header information including: frame headers, slice headers, macroblock headers, and block headers;

the predetermined criteria includes a proportion of the packets that are to receive enhanced protection, the proportion of packets being dynamically adjusted to at least approximately provide a predetermined bit rate for the second transmitting.

12. The method of claim 10 wherein:

the standard multimedia data stream is organized into fixed-size packets, each packet containing a packet header and a packet data portion, the audio data being packed into the packet data portions of audio packets and the video data being packed into the packet data portions of video packets, the packets each being logically divided multiple packet segments;

the selecting of multimedia data portions includes:

selecting substantially all the packet segments of the audio packets;

selecting substantially all the packet segments that contain video header information;

selecting sequences of packet segments containing video data that immediately following the packet segments containing video header information; and selecting the packet segments containing the packet headers of any packets in which any packet segments are selected.

13. The method of claim 1 wherein:

the standard multimedia data stream is organized into fixed-size standard transmission frames;

the method further comprising:

logically organizing the standard transmission frames into groups of multiple sequential standard transmission frames;

logically organizing selection map data and the additional unequal error correction data for the group of sequential standard transmission frames into corresponding groups of multiple fixed-size sequential enhancement data transmission portions;

the second transmitting includes transmitting the enhancement transmission frames.

14. The method of claim 13 wherein:

for a group of enhancement data transmission portions, each enhancement data transmission portion includes a fixed-size portion of the selection map data and a fixed-size portion of the additional unequal error correction data for the corresponding group of sequential enhancement transmission frames.

15. The method of claim 13 wherein for a group of standard transmission frames, all the selection map data is packed into sequential sections of the enhancement data transmission portions, and then the unequal error correction data is packed into subsequent sequential sections of the enhancement data transmission portions.

16. The method of claim 13 wherein:

sequential sections of the additional unequal error correction data are interleaved with respect to the order of the corresponding selected portions in the group of standard transmission frames.

17. A multimedia stream transmitter, comprising:

signal processing means for providing a standard multimedia data stream, the stream containing encoded multimedia data and uniform error correction data useful for error correcting the encoded multimedia data, the uniform error correction data providing substantially the same robustness of error correction for each portion of the encoded multimedia data of the standard multimedia data stream; for selecting some stream portions of the standard multimedia data stream but not other stream portions of the standard multimedia data stream, the selection depending on the importance of the type of data contained in the stream portions to the quality of the presentation of the multimedia data; and for generating additional unequal error correction data for the selected stream portions and not for other stream portions that were not selected;

transmitting means for transmitting the standard multimedia data stream, and for transmitting enhancement data including the additional unequal error correction data.

18. The transmitter of claim 17, wherein the signal processing means includes an input terminal for providing the standard multimedia data stream.

19. The transmitter of claim 17, wherein:
providing a standard multimedia data stream includes: providing encoded multimedia data; generating the uniform error correction data for the encoded multimedia data; and generating the standard multimedia data stream containing the encoded multimedia data and uniform error correction data.

20. The transmitter of claim 19, wherein the signal processing means includes an encoded input terminal for providing the encoded multimedia data.

21. The transmitter of claim 19, wherein:
providing encoded multimedia data includes: providing raw multimedia data and compressing the raw multimedia data to provide the encoded multimedia data.

22. The transmitter of claim 21, wherein the signal processing means includes an input terminal for providing the raw multimedia data.

23. A multimedia stream transmitter, comprising:
a receiver for receiving raw multimedia data;
an encoder that compresses the raw multimedia data for providing encoded multimedia data;
a first error correction generator that generates uniform error correction data for the encoded multimedia data, the uniform error correction data providing substantially the same robustness of error correction for each portion of the encoded multimedia data;
a multiplexer that formats the encoded multimedia data and the uniform error correction data to provide a standard multimedia data stream;
a selector that selects some stream portions of the standard multimedia data stream but not other stream portions of the standard multimedia data stream for additional unequal error correction, the selection depending on the importance of the type of data contained in the stream portions to the quality of the presentation of the multimedia data;
a second error correction generator that generates additional unequal error correction data for the selected stream portions and not for other stream portions that were not selected;
a first transmitter for transmitting the standard multimedia data stream; and
a second transmitter for transmitting enhancement data including the additional unequal error correction data.

24. A multimedia data stream receiver, comprising:
receiving means for receiving a standard multimedia data stream, the standard stream containing encoded multimedia data and uniform error correction data; and for receiving enhancement data including unequal error correction data;
processing means for first error correcting portions of the standard stream using the additional unequal error correction data, indicating that some portions of the standard stream are to be corrected in the first correcting and other portions of the standard stream are not be corrected in the first correcting; and for second error correcting all the encoded multimedia data using the uniform error correction data, the uniform error correcting providing substantially the same robustness of error correction for each portion of the multimedia data of the standard stream; and
transmission means for transmitting the error corrected encoded multimedia data after the first and second error correcting of the data.

25. The multimedia stream transmitter of claim 23 wherein:
the processing means generates selection map data indicating portions of the stream selected for additional unequal error correction; and
the transmitting means transmits the selection map data to substantially accompany in time the error corrected encoded multimedia data.

26. A multimedia data stream receiver, comprising:
a first receiver that receives a standard multimedia data stream, the standard stream containing encoded multimedia data and uniform error correction data for error correction of the encoded multimedia data, the uniform error correction data providing substantially the same robustness of error correction for each portion of the encoded multimedia data;
a second receiver that receives enhancement data including additional unequal error correction data; the second receiver also receiving third error correction data;
a first error correction unit that error corrects the enhancement data using the third error correction data;
a second error correction unit that provides a first error correcting of portions of the standard data stream using the additional unequal error correction data;
a third error correction unit that provides a second error correcting of the encoded multimedia data using the uniform error correction data;
an output for transmitting the error corrected encoded multimedia data after the first and second error correcting of the data.

27. The multimedia data stream receiver of claim 26 wherein the first receiver is to receive the standard multimedia data stream from a first channel;
the second receiver is to receive the enhancement data including selection map data and additional unequal error correction data from a second channel; the second receiver also receiving third error correction data from the second channel; the second channel being a different channel than the first channel; and
the second error correction unit is to provide the first error correcting of portions of the standard data stream according to the selection map data using the additional unequal error correction data.

* * * * *